(12) United States Patent
Tian et al.

(10) Patent No.: US 12,089,350 B2
(45) Date of Patent: Sep. 10, 2024

(54) DISPLAY DEVICE AND ELECTRONIC DEVICE HAVING POLARIZER WITH CONDUCTIVE PARTICLES

(71) Applicant: WUHAN CHINA STAR OPTOELECTRONICS TECHNOLOGY CO., LTD., Wuhan (CN)

(72) Inventors: Dong Tian, Wuhan (CN); Gege Zhou, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/440,155

(22) PCT Filed: Jul. 23, 2021

(86) PCT No.: PCT/CN2021/108277
§ 371 (c)(1),
(2) Date: Sep. 16, 2021

(87) PCT Pub. No.: WO2022/262075
PCT Pub. Date: Dec. 22, 2022

(65) Prior Publication Data
US 2024/0023252 A1    Jan. 18, 2024

(30) Foreign Application Priority Data
Jun. 18, 2021   (CN) .......................... 202110675585.7

(51) Int. Cl.
*H05K 5/00*   (2006.01)
*G06V 40/12*   (2022.01)
(Continued)

(52) U.S. Cl.
CPC ....... *H05K 5/0018* (2022.08); *G06V 40/1318* (2022.01); *G06V 40/1329* (2022.01);
(Continued)

(58) Field of Classification Search
CPC ...... H05K 5/0018; H05K 1/028; H05K 1/111; H05K 5/0069; H05K 2201/09227;
(Continued)

(56) References Cited

U.S. PATENT DOCUMENTS

2018/0095324 A1* 4/2018 Li .................... G06F 3/0412
2018/0217465 A1   8/2018 Nagata et al.

FOREIGN PATENT DOCUMENTS

CN   109752877 A   5/2019
CN   110018585 A   7/2019
(Continued)

OTHER PUBLICATIONS

Guo et al. CN110018585A,machine translation Jul. 2019 (Year: 2019).*
(Continued)

*Primary Examiner* — Tracie Y Green
(74) *Attorney, Agent, or Firm* — PV IP PC; Wei Te Chung

(57) ABSTRACT

A display device and an electronic device are provided. The display device has an array substrate, a touch function layer, a backlight module, and a first polarizer. By coating and/or embedding conductive particles on the first adhesive layer, a conductive film layer that is electrically connected to a backlight metal frame can be formed between a backlight film and the touch function layer. A capacitance formed by the backlight metal frame and the touch function layer can be reduced or eliminated, so as to reduce or avoid mechanical vibration of the film.

20 Claims, 3 Drawing Sheets

(51) Int. Cl.
*G06V 40/13* (2022.01)
*H05K 1/02* (2006.01)
*H05K 1/11* (2006.01)

(52) U.S. Cl.
CPC ......... *G06V 40/1341* (2022.01); *H05K 1/028* (2013.01); *H05K 1/111* (2013.01); *H05K 5/0069* (2013.01); *H05K 2201/09227* (2013.01); *H05K 2201/10128* (2013.01)

(58) Field of Classification Search
CPC ..... H05K 2201/10128; G06V 40/1318; G06V 40/1329; G06V 40/1341
See application file for complete search history.

(56) References Cited

FOREIGN PATENT DOCUMENTS

| | | |
|---|---|---|
| CN | 110471558 A | 11/2019 |
| CN | 110928010 A | 3/2020 |
| CN | 111025741 A | 4/2020 |
| CN | 111488079 A | 8/2020 |

OTHER PUBLICATIONS

Lin CN110928010A machine translation Nov. 2019 (Year: 2019).*
Translation of written opinion (Year: 2022).*
International Search Report in International application No. PCT/CN2021/108277, mailed on Mar. 16, 2022.
Written Opinion of the International Searching Authority in International application No. PCT/CN2021/108277, mailed on Mar. 16, 2022.
Chinese Office Action in corresponding Chinese Patent Application No. 202110675585.7 dated Jan. 13, 2022, pp. 1-7.

* cited by examiner

DISPLAY DEVICE AND ELECTRONIC DEVICE HAVING POLARIZER WITH CONDUCTIVE PARTICLES

RELATED APPLICATIONS

This application is a Notional Phase of PCT Patent Application No. PCT/CN2021/108277 having international filing date of Jul. 23, 2021, which claims the benefit of priority of Chinese Patent Application No. 202110675585.7 filed on Jun. 18, 2021. The contents of the above applications are all incorporated by reference as if fully set forth herein in their entirety.

FIELD OF DISCLOSURE

The present disclosure relates to displays, and more particularly to a display device and an electronic device.

BACKGROUND OF DISCLOSURE

A howling problem has become a major problem in the display screen industry in recent years. The so-called howling means that when a human body is close to a display screen, the human body will continue to hear a babble sound similar to sound induced by an electric current, and the sound level varies with sensitivity of different people to low-frequency/high-frequency sound. As shown in FIG. 1, one of reasons for occurring howling is that: during a touch operation of a touch display product, a touch IC1 (integrated circuit) sends out an alternating scan pulse signal with a voltage of 0-3V. A backlight metal frame 4 and a touch function layer 2 in the backlight module 3 are respectively constituted as two plates of a capacitor. Due to a constant change of a pressure difference in the capacitor, a film in the backlight module is constantly mechanically vibrated by a reverse piezoelectric action, so as to form a howling.

It should be noted that the above introduction of the background technology is only to facilitate a clear and complete understanding of the technical solutions of the present application. Therefore, it cannot be considered that the above-mentioned technical solutions involved are known to those skilled in the art just because it appears in the background art of the present application.

SUMMARY OF DISCLOSURE

The present application provides a display device and an electronic device to alleviate a technical problem of howling in a display device.

In a first aspect, the present application provides a display device comprising: an array substrate, a touch function layer, a backlight module, and a first polarizer. The touch function layer is located on a side of the array substrate. The backlight module is located on another side of the array substrate, wherein the backlight module comprises a backlight metal frame and a backlight film disposed in the backlight metal frame. The first polarizer is located between the array substrate and the backlight module, wherein the first polarizer comprises a first adhesive layer and conductive particles, the conductive particles are coated and/or embedded in the first adhesive layer, at least part of the conductive particles are adjacent to the another side of the array substrate, and the conductive particles are electrically connected with the backlight metal frame In one embodiment, the first polarizer further comprises: a first partition and a second partition. The first partition coincides with an orthographic projection of the array substrate. The second partition is adjacent to the first partition, wherein the second partition protrudes from a side surface of the array substrate, and the conductive particles located in the second partition are electrically connected to the backlight metal frame.

In one embodiment, the display device further comprises: a first pad electrically connected to the conductive particles located in the second partition and the backlight metal frame.

In one embodiment, the display device further comprises: a first conductive trace, a second conductive trace, and a third conductive trace. The first conductive trace is electrically connected to the conductive particles located in the second partition, wherein an orthographic projection of the first conductive trace is located in the second partition. The second conductive trace is electrically connected to the first conductive trace, wherein the second conductive trace is attached to the side surface of the array substrate. The third conductive trace is electrically connected to the second conductive trace and the first pad, wherein the third conductive trace is located on a front surface of the array substrate In one embodiment, the display device further comprises: a fourth conductive trace and a second pad. The fourth conductive trace is electrically connected to the first pad. The second pad is electrically connected to the fourth conductive trace and the backlight metal frame In one embodiment, the display device further comprises: a flexible circuit board comprising at least one transmission wire, wherein an end of the at least one transmission wire is electrically connected to the second pad, and an exposed conductive part of the at least one transmission wire is electrically connected to the backlight metal frame.

In one embodiment, a distance from the second pad to a display area of the display device is greater than a distance from the first pad to the display area of the display device, and a distance from the second pad to a side surface of the array substrate is greater than a distance from the first pad to the side surface of the array substrate.

In one embodiment, a zero potential is electrically connected to the backlight metal frame or the at least one transmission wire.

In one embodiment, the display device further comprises: a second polarizer and a color filter substrate. The second polarizer is located on a side of the touch function layer and far away from the array substrate. The color filter substrate is located between the array substrate and the touch function layer, and the color filter substrate comprises a first color filter area and a second color filter area adjacent to each other, wherein the first color film area covers an orthographic projection of the second polarizer, and the second color film area is not covered by the orthographic projection of the second polarizer.

In one embodiment, the display device further comprises: a fifth conductive trace and a sixth conductive trace. The fifth conductive trace is electrically connected to the first pad, wherein the fifth conductive trace extends along a sidewall of the color filter substrate. The sixth conductive trace is electrically connected to the fifth conductive trace and adjacent to the second polarizer, wherein the sixth conductive trace is located in the second color film area.

In one embodiment, material of the conductive particles, material of the first conductive trace, material of the second conductive trace, material of the third conductive trace, and material of the first pad all at least comprise silver.

In one embodiment, an extension direction of the fifth conductive trace is different from an extension direction of the sixth conductive trace, and material of the conductive particles is the same as material of the fifth conductive trace and material of the sixth conductive trace.

In one embodiment, the first polarizer further comprises: a second adhesive layer, a first protective layer, a first polarizing film, and a second protective layer. The second adhesive layer is located between the backlight module and the first adhesive layer. The first protective layer is located between the first adhesive layer and the second adhesive layer. The first polarizing film is located between the first protective layer and the second adhesive layer. The second protective layer is located between the first polarizing film and the second adhesive layer.

In a second aspect, the present application provides an electronic device comprising a display device according to the above embodiments, wherein the first adhesive layer is a double-sided adhesive layer.

A display device and an electronic device are provided. By coating and/or embedding conductive particles on the first adhesive layer, a conductive film layer that is electrically connected to a backlight metal frame can be formed between a backlight film and the touch function layer. A capacitance formed by the backlight metal frame and the touch function layer can be reduced or eliminated, so as to reduce a reverse piezoelectric effect of the backlight film in the backlight module and to reduce or avoid mechanical vibration of the film.

DETAILED DESCRIPTION OF PREFERRED EMBODIMENTS

In order to make a purpose, technical solutions, and effects of this application clearer and clearer, the following further describes this application in detail with reference to the accompanying drawings and examples. It should be understood that the specific embodiments described here are only used to explain the present application, and are not used to limit the present application.

Figure 1:
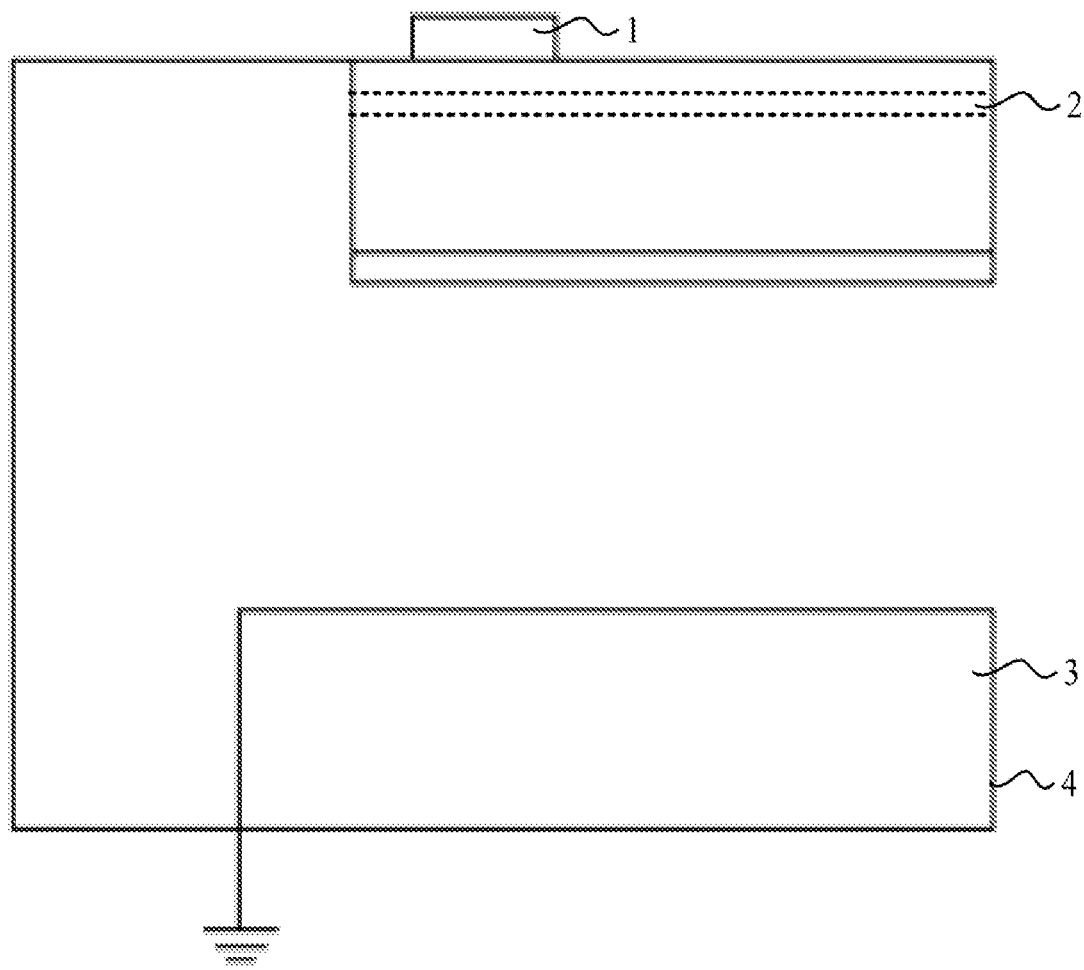
FIG. 1 is a schematic diagram of a structure of a display device in a conventional technical solution.
Figure 2:
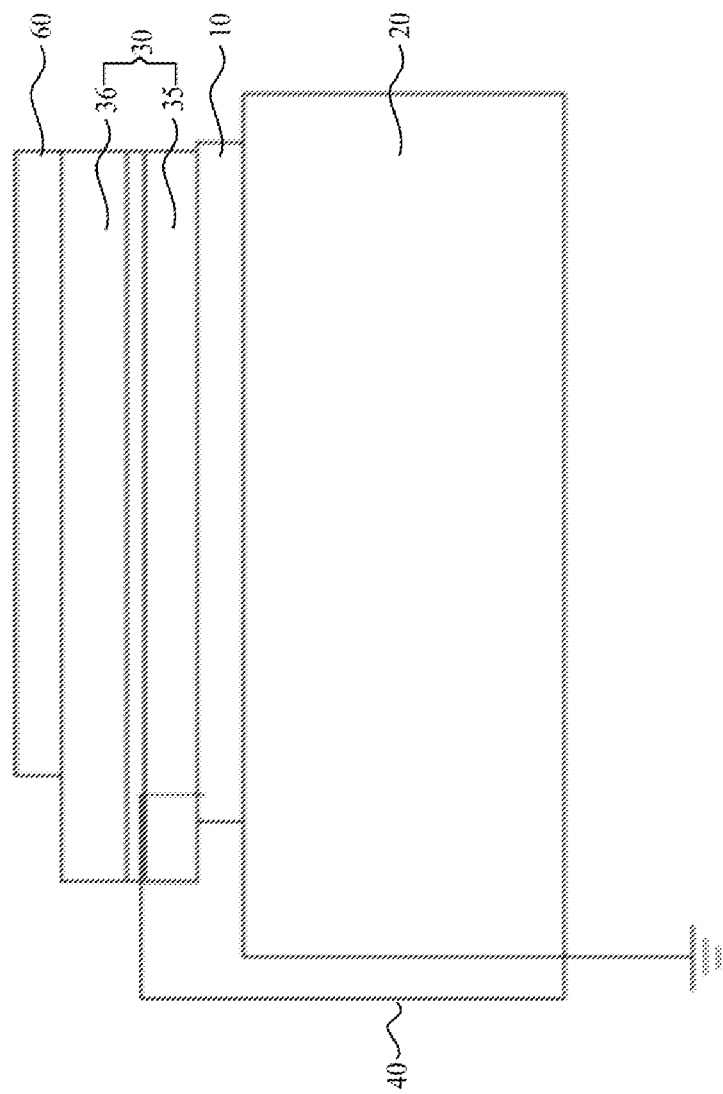
FIG. 2 is a schematic diagram of a structure of a display device provided by an embodiment of the application.
Figure 3:
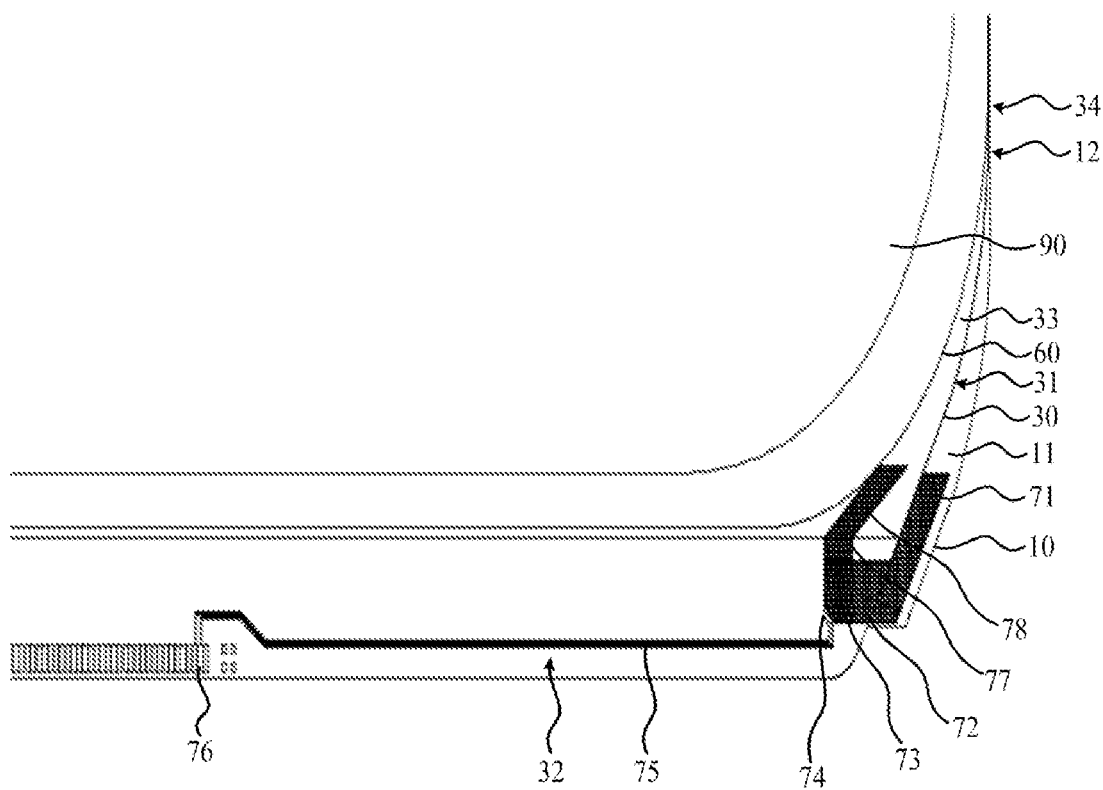
FIG. 3 is a schematic diagram of another structure of a display device provided by an embodiment of the application.
Figure 4:
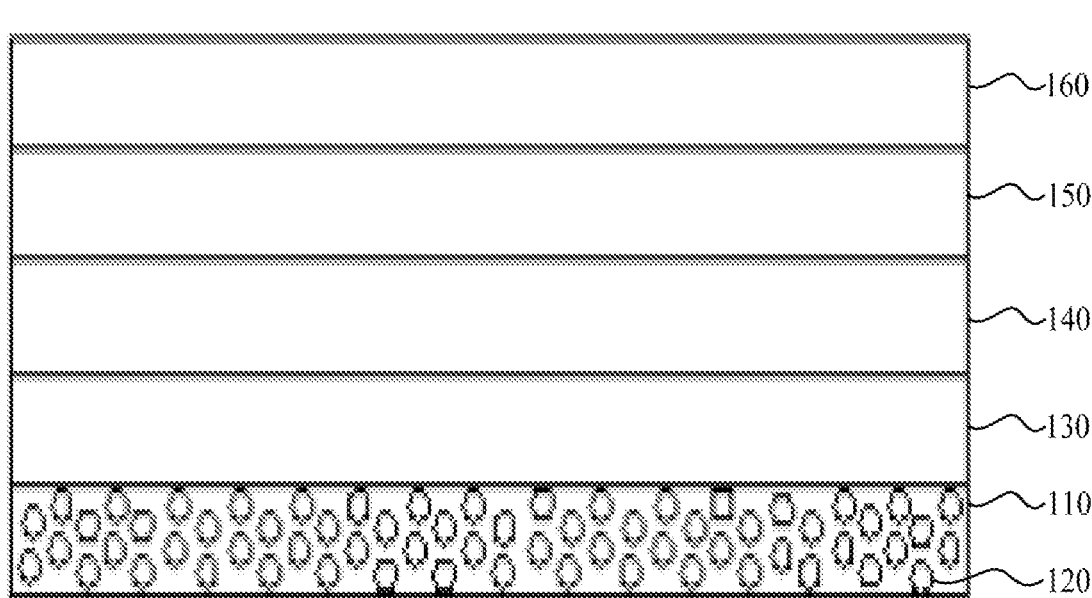
FIG. 4 is a schematic structural diagram of a first polarizer provided by an embodiment of the application.

Refer to FIGS. 2 to 4. As shown in FIG. 2, this embodiment provides a display device, which includes an array substrate 35, a touch function layer 90, a backlight module, and a first polarizer 10. The touch function layer 90 is located on a side of the array substrate 35. The backlight module is located on another side of the array substrate 35. The backlight module includes a backlight metal frame 20 and a backlight film placed in the backlight metal frame 20. The first polarizer 10 is located between the array substrate 35 and the backlight module. The first polarizer 10 includes a first adhesive layer 110 and conductive particles 120. The conductive particles 120 are coated and/or embedded in the first adhesive layer 110. At least part of the conductive particles 120 is adjacent to the other side of the array substrate 35, and the conductive particles 120 are electrically connected to the backlight metal frame 20.

It can be understood that, in a display device provided by the present embodiment, by coating and/or embedding conductive particles 120 on the first adhesive layer 110, a conductive film layer that is electrically connected to a backlight metal frame 20 can be formed between a backlight film and the touch function layer 90. A capacitance formed by the backlight metal frame 20 and the touch function layer 90 can be reduced or eliminated, so as to reduce a reverse piezoelectric effect of the backlight film in the backlight module and to reduce or avoid mechanical vibration of the film.

It should be noted that integrating the conductive particles 120 into the first adhesive layer 110 can not only save module space, i.e., reduce the thickness of the display device, but also reduce or eliminate the capacitance formed by the backlight metal frame 20 and the touch function layer 90.

It should be noted that in this embodiment, the display device may include a display panel 30, which includes an array substrate 35, a color filter substrate 36, and a liquid crystal layer or a liquid crystal cell located between the two.

In one embodiment, the first polarizer 10 further includes a first partition 12 and a second partition 11, and the first partition 12 coincides with an orthographic projection of the array substrate 35. The second partition 11 is adjacent to the first partition 12, the second partition 11 protrudes from a side surface 31 of the array substrate 35, and the conductive particles 120 located in the second partition 11 are electrically connected to the backlight metal frame 20.

It should be noted that in this embodiment, the side surface 31 of the array substrate 35 may be a right side surface of the display device.

As shown in FIG. 3, in one embodiment, the display device further includes a first conductive trace 71, a second conductive trace 72, a third conductive trace 73, and a first pad 74. The first conductive trace 71 is electrically connected to the conductive particles 120 located in the second partition 11, and an orthographic projection of the first conductive trace 71 is located in the second partition 11. The second conductive trace 72 is electrically connected to the first conductive trace 71, and the second conductive trace 72 is attached to the side surface 31 of the array substrate 35. The third conductive trace 73 is electrically connected to the second conductive trace 72, and the third conductive trace 73 is located on a front surface 32 of the array substrate 35. The first pad 74 is electrically connected to the third conductive trace 73 and the backlight metal frame 20. It should be noted that, in this embodiment, the front surface 32 of the array substrate 35 may be a front view surface of the display device.

In one embodiment, the display device further includes a fourth conductive trace 75 and a second pad 76. The fourth conductive trace 75 is electrically connected to the first pad 74. The second pad 76 is electrically connected to the fourth conductive trace 75 and the backlight metal frame 20. A distance from the second pad 76 to the display area of the display device is greater than a distance from the first pad 74 to a display area of the display device, and a distance from the second pad 76 to the side surface 31 of the array substrate 35 is greater than a distance from the first pad 74 to the side surface 31 of the array substrate 35.

In one embodiment, the display device further includes a flexible circuit board 40. The flexible circuit board 40 includes at least one transmission wire. One end of at least one transmission wire is electrically connected to the second pad 76, and an exposed conductive part of at least one transmission wire is electrically connected to the backlight metal frame 20.

In one embodiment, a zero potential is electrically connected to the backlight metal frame 20 or at least one transmission wire.

It is understandable that in this embodiment, potentials of the conductive particles 120 and the backlight metal frame 20 can be stabilized at zero potential, which is more beneficial to shield or disperse the capacitance formed between the backlight metal frame 20 and the touch function layer 90.

In one embodiment, the display device further includes a second polarizer 60 and a color filter substrate 36. The second polarizer 60 is located on one side of the touch function layer 90 and far away from the array substrate 35. The color filter substrate 36 is located between the array substrate 35 and the touch function layer 90, and the color filter substrate 36 includes a first color filter area 34 and a second color filter area 33 adjacent to each other. The first color film area 34 covers an orthographic projection of the second polarizer 60, and the second color film area 33 is not covered by the orthographic projection of the second polarizer 60.

In one embodiment, the display device further includes a fifth conductive trace 77 and a sixth conductive trace 78. The fifth conductive trace 77 is electrically connected to the first pad 74, and the fifth conductive trace 77 extends along a sidewall of the color filter substrate 36. The sixth conductive trace 78 is electrically connected to the fifth conductive trace 77 and is adjacent to the second polarizer 60, wherein the sixth conductive trace 78 is located in the second color film area 33.

It should be noted that in this embodiment, a static electricity collected by the second polarizer 60 can pass through the fifth conductive trace 77, the sixth conductive trace 78, the first pad 74, the fourth conductive trace 75, the second pad 76, and the flexible circuit board 40 (or the backlight metal frame 20) forms a discharge path, which can prevent the second polarizer 60 from being disturbed by static electricity.

In one embodiment, an extension direction of the first conductive trace 71 is different from an extension direction of the second conductive trace 72 and an extension direction of the third conductive trace 73. The extension direction of the second conductive trace 72 is different from the extension direction of the third conductive trace 73.

Understandably, the extension direction of the above-mentioned traces in this embodiment can achieve the electrical connection between the conductive particles 120 in the first adhesive layer 110 and the backlight metal frame 20 without changing an original structure of the display or changing the original structure of the display panel as little as possible.

In one embodiment, material of the conductive particles 120, material of the first conductive trace 71, material of the second conductive trace 72, material of the third conductive trace 73, and material of the first pad 74 all at least include silver.

In one embodiment, material of the fifth conductive trace 77 and the material of the sixth conductive trace 78 may both at least include silver.

At least one of the first conductive trace 71, the second conductive trace 72, the third conductive trace 73, the fourth conductive trace 75, the fifth conductive trace 77, and the sixth conductive trace 78 can be formed on the surface of the corresponding structure by coating silver paste. Therefore, a shape of these conductive traces can be irregular or not fixed. For example, its contour can be non-linear. For another example, the shape of the conductive traces in one display device is different from the shape of the conductive traces in another display device.

It is understandable that silver has relatively stable physical and chemical properties, good thermal and electrical conductivity, soft quality, rich ductility, and extremely high light reflectivity. It is convenient for the conductive traces to be welded with silver paste and attached to the surface of the corresponding carrier.

In one embodiment, an extension direction of the fifth conductive trace 77 is different from an extension direction of the sixth conductive trace, and material of the conductive particles 120 is the same as material of the fifth conductive trace 77 and material of the sixth conductive trace 78.

As shown in FIG. 4, in one embodiment, the first polarizer 10 further includes a second adhesive layer 160, a first protective layer 130, a first polarizing film 140, and a second protective layer 150. The second adhesive layer 160 is located between the backlight module and the first adhesive layer 110. The first adhesive layer 110 is a double-sided adhesive layer; the first protective layer 130 is located between the first adhesive layer 110 and the second adhesive layer 160; the first polarizing film 140 is located between the first protective layer 130 and the second adhesive layer 160; and the second protective layer 150 is located between the first polarizing film 140 and the second adhesive layer 160.

It should be noted that the second adhesive layer 160 may be, but is not limited to, a pressure-sensitive adhesive layer, and may also be a double-sided pressure-sensitive adhesive layer.

In one embodiment, the display device further includes a touch display chip. The touch display chip integrates the functions of traditional data driver and a touch chip, which can achieve a touch function and a display function with a small occupied space (because the occupied space of the display device is reduced). The touch display chip is crimped on the display panel 30 and electrically connected to the flexible circuit board 40 for providing corresponding input signals for the touch display chip.

In one embodiment, the present application provides an electronic device, which includes the display device in any of the above embodiments.

It can be understood that, in an electronic device provided by the present embodiment, by coating and/or embedding conductive particles 120 on the first adhesive layer 110, a conductive film layer that is electrically connected to a backlight metal frame 20 can be formed between a backlight film and the touch function layer 90. A capacitance formed by the backlight metal frame 20 and the touch function layer 90 can be reduced or eliminated, so as to reduce a reverse piezoelectric effect of the backlight film in the backlight module and to reduce or avoid mechanical vibration of the film.

In one embodiment, the above-mentioned electronic device may be, but is not limited to, a mobile phone, and may also be a portable tablet computer or the like.

It should be noted that the display panel in this application can be, but not limited to, a liquid crystal panel. The liquid crystal panel includes a polarizing film, a glass substrate, a black matrix, a color filter, a protective film, a common electrode, a calibration layer, a liquid crystal layer (liquid crystal, spacer, sealant), a capacitor, a display electrode, a prism layer, and a light scattering layer.

A polarizing film is also called a polarizer. The polarizer is divided into an upper polarizer and a lower polarizer. The polarization functions of the upper and lower polarizers are perpendicular to each other, and their function is like a fence, blocking light wave components according to requirements. For example, the light wave component perpendicular to the barrier of the polarizer is blocked, and only the light wave component parallel to the barrier is allowed to pass.

The glass substrate can be divided into an upper substrate and a lower substrate in a liquid crystal display, and its main function is to clamp the liquid crystal material in the space between the two substrates. Material of the glass substrate generally adopts alkali-free borosilicate glass with excellent mechanical properties, heat resistance, and chemical corrosion resistance. For TFT-LCD, one layer of glass substrate is distributed with TFTs, and another layer of glass substrate is deposited with color filters.

The black matrix is used to separate the three primary colors of red, green, and blue in the color filter (to prevent color confusion) and to prevent light leakage by means of a material with high light-shielding performance, thereby helping to improve the contrast of each color block. In addition, in TFT-LCD, the black matrix can also cover the internal electrode traces or thin film transistors.

The color filter is also called a color filter film, wherein its function is to produce red, green, and blue three primary colors of light to realize the full-color display of the liquid crystal display.

The alignment layer is also called the alignment film or an orientation layer, and its function is to allow the liquid crystal molecules to achieve uniform arrangement and orientation on a microscopic level.

The transparent electrode is divided into a common electrode and a pixel electrode. The input signal voltage is loaded between a pixel electrode and a common electrode. The transparent electrode is usually formed by depositing indium tin oxide (ITO) material on a glass substrate to form a transparent conductive layer.

Liquid Crystal Material acts like a light valve in the LCD, which can control the brightness of the transmitted light, so as to achieve the effect of information display.

The driver IC is actually a set of integrated circuit chip devices, used to adjust and control the phase, peak value, frequency, etc. of the potential signal on the transparent electrode, establish a driving electric field, and finally realize the information display of the liquid crystal.

In the liquid crystal panel, the active matrix liquid crystal display is composed of a twisted nematic (TN) liquid crystal material enclosed between two glass substrates. The upper glass substrate close to the display screen is deposited with red, green, and blue (RGB) color filters (or color filters), a black matrix, and a common transparent electrode. The lower glass substrate (the substrate farther from the display screen) is equipped with thin film transistor (TFT) devices, transparent pixel electrodes, storage capacitors, gate lines, signal lines, etc. Alignment films (or alignment layers) are prepared on the inner sides of the two glass substrates to align the liquid crystal molecules. The liquid crystal material is poured between the two glass substrates, and spacers are spread to ensure the uniformity of the gap. The surroundings are bonded with the help of frame sealing glue to play a sealing role. The common electrodes of the upper and lower glass substrates are connected by means of a silver glue process.

Polarizers (or polarized films) are attached to the outer sides of the upper and lower glass substrates. When a voltage is applied between the pixel transparent electrode and the common transparent electrode, the arrangement state of the liquid crystal molecules will change. At this time, the intensity of incident light passing through the liquid crystal also changes accordingly. The liquid crystal display is based on the optical rotation of the liquid crystal material, coupled with the control of the electric field, to realize information display.

LCD products are non-active light-emitting electronic devices, which do not have light-emitting characteristics, and must rely on the emission of the light source in the backlight module to obtain display performance. Therefore, the brightness of the LCD is determined by its backlight module. It can be seen that the performance of the backlight module directly affects the display quality of the liquid crystal panel.

The backlight module includes an illuminating light source, a reflective plate, a light guide plate, a diffuser, a brightness enhancement film (prism sheet), and a frame. The backlight modules used in LCDs can be mainly divided into two categories: edge-lit backlight modules and direct-lit backlight modules. Mobile phones, notebook computers and monitors (15 inches) mainly use edge-lit backlight modules, while LCD TVs mostly use direct-type backlight module light sources. The backlight module light source mainly uses cold cathode fluorescent lamp (CCFL) and light emitting diode (LED) as the backlight source of the LCD.

The reflector sheet is also called a reflector. Its main function is to completely send the light emitted by the light source into the light guide plate, reducing useless loss as much as possible.

A main function of the light guide plate is to guide the light emitted by the side light source to the front of the panel.

Prism film is also called brightness enhancement film. A main function is to concentrate the scattered light rays through the refraction and total reflection of the film layer, and then emit them from the backlight source at a certain angle, so as to enhance the display effect of the screen.

A main function of a diffuser is to correct the edge light of the backlight module into a uniform surface light source to achieve the effect of optical diffusion. The diffuser is divided into an upper diffuser and a lower diffuser. The upper diffusion sheet is located between the prism sheet and the liquid crystal assembly and is closer to the display panel. The lower diffusion sheet is located between the light guide plate and the prism sheet, which is closer to the backlight source.

LCD is a display that uses liquid crystal as its material. Liquid crystal is a kind of organic compound between solid and liquid. Under normal temperature conditions, it exhibits both the fluidity of a liquid and the optical anisotropy of crystals. It will become a transparent liquid when heated, and will become a crystalline turbid solid after cooling.

Under the action of an electric field, the arrangement of the liquid crystal molecules will change, which will affect the intensity of the incident light beam through the liquid crystal. This change in light intensity is further manifested as a change in light and dark through the action of the polarizer. Accordingly, through the control of the electric field of the liquid crystal, the brightness of the light can be changed, so as to achieve the purpose of information display. Therefore, the role of the liquid crystal material is similar to a small "light valve."

There are control circuits and drive circuits around the liquid crystal material. When the electrodes in the LCD generate an electric field, the liquid crystal molecules will be twisted, so that the light passing through it will be regularly refracted (the optical rotation of the liquid crystal material), and then filtered by the second layer of polarizer and displayed on the screen.

It is worth pointing out that because the liquid crystal material itself does not emit light, LCD usually needs to be equipped with additional light sources for the display panel. The main light source system is called "backlight module", in which the backlight plate is composed of fluorescent material, which can emit light, and its function is mainly to provide a uniform backlight source.

LCD technology is to pour liquid crystal between two planes lined with fine grooves. The grooves on these two planes are perpendicular to each other (intersect at 90 degrees). In other words, if the molecules on one plane are aligned north-south, the molecules on the other plane are aligned east-west, and the molecules between the two planes are forced into a 90-degree twisted state. Since the light travels along the direction of the arrangement of the molecules, the light is also twisted 90 degrees when passing through the liquid crystal. When a voltage is applied to the liquid crystal, the liquid crystal molecules will rotate to change the light transmittance, thereby realizing multi-gray scale display.

LCD usually consists of two mutually perpendicular polarizers. The polarizer acts like a fence, blocking light wave components as required. For example, the light wave component perpendicular to the barrier of the polarizer is blocked, and only the light wave component parallel to the barrier is allowed to pass. Natural light radiates randomly in all directions. Two polarizers perpendicular to each other should block all natural light that attempts to penetrate under normal circumstances. However, because the two polarizers are filled with twisted liquid crystals, after the light passes through the first polarizer, it will be twisted 90 degrees by the liquid crystal molecules, and finally pass through the second polarizer.

For notebook computers or desktop LCDs, more complex color displays are required.

As far as color LCDs are concerned, they also need to have a color filter layer that specializes in color display, the so-called "color filter", also known as "color filtering film." In a color LCD panel, each pixel is usually composed of 3 liquid crystal cells. There are three-color filters of red, green, or blue (RGB) in front of each cell. In this way, the light passing through different cells can display different colors on the screen.

The color filter, the black matrix, and the common transparent electrode are generally deposited on the front glass substrate of the display screen. Color LCD can create colorful images in high-resolution environments.

Human visual organs (eyes) perceive dynamic images with the phenomenon of so-called "visual residual", that is, high-speed moving pictures will form a short-lived impression in the human brain. Early cartoons, movies and even the latest game shows applied the principle of "visual residue", allowing a series of gradual images to be displayed in rapid succession in front of people's eyes, forming dynamic images.

When the production speed of multiple images exceeds 24 frames/s, the human eyes will perceive continuous images. This is also the origin of the movie playback speed of 24 frames per second. If the display speed is lower than this standard, people will obviously feel the pause and discomfort of the picture. Calculated according to this index, the display time of each picture needs to be less than 40 ms. Fast moving pictures are displayed with high definition, and the general video movement speed exceeds 60 frames/s. That is to say, the interval time of each frame of the active picture is 16.67 ms.

If the response time of the liquid crystal is longer than the interval time of each frame of the screen, people will feel that the screen is a little fuzzy when watching fast-moving images. Response time is a special indicator of LCD. The response time of LCD refers to the speed at which each pixel of the display reacts to the input signal, which is the response time of the liquid crystal from "dark to bright" or from "bright to dark". This value is as small as possible, and a sufficiently fast response time can ensure the continuity of the picture. If the response time is too long, it is possible that the LCD will have the feeling of trailing shadows when displaying dynamic images. The general response time of LCD is 2-5 ms.

The so-called TFT refers to the transistor array on the glass substrate of the liquid crystal panel, so that each pixel of the LCD is equipped with its own semiconductor switch. Each pixel can control the liquid crystal between the two glass substrates through dot pulses, that is, through active switches to achieve independent and precise control of each pixel "point-to-point". Therefore, each node of the pixel is relatively independent and can be continuously controlled.

The TFT LCD is mainly composed of a glass substrate, a gate electrode, a drain electrode, a source electrode, a semiconductor active layer (a-Si), and the like.

The TFT array is generally deposited together with transparent pixel electrodes, storage capacitors, gate lines, signal lines, etc. on the rear glass substrate of the display screen (the substrate farther from the display screen). The configuration of such a transistor array helps to improve the response speed of the liquid crystal display, and can also control the display gray level, thereby ensuring that the image color of the LCD is more realistic and the picture quality is more pleasing to the eye. Therefore, most LCDs, LCD TVs and some mobile phones are driven by TFT. Whether it is a small and medium-sized LCD with a narrow viewing angle twisted nematic (TN) mode, or a large-sized liquid crystal TV (LCD-TV) with a wide viewing angle of parallel arrangement (IPS) mode, they are commonly referred to as "TFT-LCD".

The LCD touch screen, also known as the touch panel, is an inductive liquid crystal display device that can receive input signals such as contacts. When the graphic buttons on the screen are touched, the tactile feedback system on the screen can drive various connection devices according to the pre-programmed programs, which can be used to replace the mechanical button panel, and use the liquid crystal display screen to create dynamic audio-visual effects.

The LCD touch screen has gradually replaced the keyboard as a commonly used human-computer interaction tool for embedded systems due to its advantages of lightness, less space, convenience and flexibility. Touch screens can be divided into five categories according to their technical principles: vector pressure sensor type, resistive type, capacitive type, infrared type, surface acoustic wave type, wherein resistive touch screens are used more in embedded systems.

The working part of a typical touch screen is generally composed of three parts: two transparent resistive conductor layers; an isolation layer between the two conductors; and electrodes. The resistive conductor layer is made of resistive materials, such as indium tin oxide (ITO) coated on the substrate, the upper substrate is made of plastic, and the lower substrate is made of glass. The isolation layer is a viscous insulating liquid material, such as polyester film. The electrode is made of materials with excellent conductivity (such as silver powder ink), and its conductivity is about 1000 times that of ITO.

In order to facilitate the operation, people use a touch screen to replace the mouse or keyboard. When working, we must first touch the touch screen installed on the front of the display with a finger or other object, and then the system locates and selects information input according to the position of the icon or menu touched by the finger. The touch screen is composed of a touch detection component and a touch screen controller. The touch detection component is installed in front of the display screen to detect the user's touch position and send it to the touch screen controller after acceptance. The main function of the touch screen controller is to receive touch information from the touch point detection device, convert it into contact coordinates, and then send it to the CPU. It can receive commands from the CPU and execute them at the same time.

Touch screens can include five basic categories: vector pressure sensing technology touch screens, resistive technology touch screens, capacitive technology touch screens, infrared technology touch screens, and surface acoustic wave technology touch screens. According to the working principle of the touch screen and the medium of information transmission. The touch screen may include a resistive touch screen, a capacitive sensing touch screen, an infrared touch screen, and a surface acoustic wave touch screen.

The resistive touch screen is controlled by pressure sensing. The main part of the resistive touch screen is a resistive film screen that fits well with the surface of the display. This is a multi-layer composite film. It uses a glass or hard plastic flat plate as the base layer, and the surface is coated with a transparent oxide metal (transparent conductive resistance) conductive layer, and then covered with a hardened outer surface, smooth and anti-scratch plastic layer. Its inner surface is also coated with a layer of coating, and there are many small (less than 1/1000 inch) transparent isolation points between them to isolate the two conductive layers. When the finger touches the screen, the two conductive layers are in contact at the touch point, the resistance changes, signals are generated in the X and Y directions, and then sent to the touch screen controller. The controller detects this contact and calculates the position of (X, Y), and then operates according to the way of simulating a mouse. This is the most basic principle of resistive technology touch screens. The key to resistive touch screens lies in materials. Commonly used transparent conductive coating materials include:

ITO (indium oxide) is a weak electrical conductor. The characteristic is that when the thickness drops below 1800 angstroms (angstroms=10-10 meters), it suddenly becomes transparent, and the light transmittance is 80%. When it becomes thinner, the light transmittance decreases, and when it reaches a thickness of 300 angstroms, it rises to 80%. ITO is the main material used in all resistive technology touch screens and capacitive technology touch screens. In fact, the working surface of the resistive and capacitive technology touch screen is ITO coating.

Nickel-gold coating: the outer conductive layer of the five-wire resistive touch screen uses a nickel-gold coating material with good ductility. Due to frequent touches of the outer conductive layer, the purpose of using a nickel-gold material with good ductility is to prolong the service life, but the process cost is relatively high. Although the nickel-gold conductive layer has good ductility, it can only be used as a transparent conductor and is not suitable for the working surface of a resistive touch screen. Because of its high conductivity, and the metal is not easy to be very uniform in thickness, it is not suitable for voltage distribution layer, but only as a probe layer.

It can be understood that, for those of ordinary skill in the art, equivalent replacements or changes can be made according to the technical solution of the present application and its inventive concept, and all these changes or replacements shall fall within the protection scope of the appended claims of the present application.

The invention claimed is:

1. A display device, comprising:
   an array substrate;
   a touch function layer located on a side of the array substrate;
   a backlight module located on another side of the array substrate, wherein the backlight module comprises a backlight metal frame and a backlight film disposed in the backlight metal frame; and
   a first polarizer located between the array substrate and the backlight module, wherein the first polarizer comprises a first adhesive layer and conductive particles, the conductive particles are coated and/or embedded in the first adhesive layer, at least part of the conductive particles are adjacent to the another side of the array substrate, and the conductive particles are electrically connected with the backlight metal frame;
   wherein the first polarizer further comprises:
   a first partition coinciding with an orthographic projection of the array substrate; and
   a second partition adjacent to the first partition, wherein the second partition protrudes from a side surface of the array substrate, and the conductive particles located in the second partition are electrically connected to the backlight metal frame.

2. The display device according to claim 1, wherein the display device further comprises:
   a first pad electrically connected to the conductive particles located in the second partition and the backlight metal frame.

3. The display device according to claim 2, wherein the display device further comprises:
   a first conductive trace electrically connected to the conductive particles located in the second partition, wherein an orthographic projection of the first conductive trace is located in the second partition;
   a second conductive trace electrically connected to the first conductive trace, wherein the second conductive trace is attached to the side surface of the array substrate; and
   a third conductive trace electrically connected to the second conductive trace and the first pad, wherein the third conductive trace is located on a front surface of the array substrate.

4. The display device according to claim 2, wherein the display device further comprises:
   a fourth conductive trace electrically connected to the first pad; and
   a second pad electrically connected to the fourth conductive trace and the backlight metal frame.

5. The display device according to claim 4, wherein the display device further comprises:
   a flexible circuit board comprising at least one transmission wire, wherein an end of the at least one transmission wire is electrically connected to the second pad, and an exposed conductive part of the at least one transmission wire is electrically connected to the backlight metal frame.

6. The display device according to claim 4, wherein a distance from the second pad to a display area of the display device is greater than a distance from the first pad to the display area of the display device, and a distance from the second pad to a side surface of the array substrate is greater than a distance from the first pad to the side surface of the array substrate.

7. The display device according to claim 5, wherein a zero potential is electrically connected to the backlight metal frame or the at least one transmission wire.

8. The display device according to claim 2, wherein the display device further comprises:
   a second polarizer located on a side of the touch function layer and far away from the array substrate; and
   a color filter substrate located between the array substrate and the touch function layer, and the color filter substrate comprises a first color filter area and a second color filter area adjacent to each other, wherein the first color film area covers an orthographic projection of the second polarizer, and the second color film area is not covered by the orthographic projection of the second polarizer.

9. The display device according to claim 8, wherein the display device further comprises:
   a fifth conductive trace electrically connected to the first pad, wherein the fifth conductive trace extends along a sidewall of the color filter substrate; and
   a sixth conductive trace electrically connected to the fifth conductive trace and adjacent to the second polarizer, wherein the sixth conductive trace is located in the second color film area.

10. The display device according to claim 3, wherein material of the conductive particles, material of the first conductive trace, material of the second conductive trace, material of the third conductive trace, and material of the first pad all at least comprise silver.

11. The display device according to claim 9, wherein an extension direction of the fifth conductive trace is different from an extension direction of the sixth conductive trace, and material of the conductive particles is the same as material of the fifth conductive trace and material of the sixth conductive trace.

12. The display device according to claim 1, wherein the first polarizer further comprises:
   a second adhesive layer located between the backlight module and the first adhesive layer;
   a first protective layer located between the first adhesive layer and the second adhesive layer;
   a first polarizing film located between the first protective layer and the second adhesive layer; and
   a second protective layer located between the first polarizing film and the second adhesive layer.

13. An electronic device, comprising a display device comprising:
   an array substrate;
   a touch function layer located on a side of the array substrate;
   a backlight module located on another side of the array substrate, wherein the backlight module comprises a backlight metal frame and a backlight film disposed in the backlight metal frame; and
   a first polarizer located between the array substrate and the backlight module, wherein the first polarizer comprises a first adhesive layer and conductive particles, the conductive particles are coated and/or embedded in the first adhesive layer, at least part of the conductive particles are adjacent to the another side of the array substrate, and the conductive particles are electrically connected with the backlight metal frame;
   wherein the first polarizer further comprises:
   a first partition coinciding with an orthographic projection of the array substrate; and
   a second partition adjacent to the first partition, wherein the second partition protrudes from a side surface of the array substrate, and the conductive particles located in the second partition are electrically connected to the backlight metal frame;
   wherein the first adhesive layer is a double-sided adhesive layer.

14. The electronic device according to claim 13, wherein the display device further comprises:
   a first pad electrically connected to the conductive particles located in the second partition and the backlight metal frame.

15. The electronic device according to claim 14, wherein the display device further comprises:
   a first conductive trace electrically connected to the conductive particles located in the second partition, wherein an orthographic projection of the first conductive trace is located in the second partition;
   a second conductive trace electrically connected to the first conductive trace, wherein the second conductive trace is attached to the side surface of the array substrate; and
   a third conductive trace electrically connected to the second conductive trace and the first pad, wherein the third conductive trace is located on a front surface of the array substrate.

16. The electronic device according to claim 14, wherein the display device further comprises:
   a fourth conductive trace electrically connected to the first pad; and
   a second pad electrically connected to the fourth conductive trace and the backlight metal frame.

17. The electronic device according to claim 16, wherein the display device further comprises:
   a flexible circuit board comprising at least one transmission wire, wherein an end of the at least one transmission wire is electrically connected to the second pad, and an exposed conductive part of the at least one transmission wire is electrically connected to the backlight metal frame.

18. The electronic device according to claim 16, wherein a distance from the second pad to a display area of the display device is greater than a distance from the first pad to the display area of the display device, and a distance from the second pad to a side surface of the array substrate is greater than a distance from the first pad to the side surface of the array substrate.

19. The display device according to claim 17, wherein a zero potential is electrically connected to the backlight metal frame or the at least one transmission wire.

20. The display device according to claim 14, wherein the display device further comprises:
   a second polarizer located on a side of the touch function layer and far away from the array substrate; and
   a color filter substrate located between the array substrate and the touch function layer, and the color filter substrate comprises a first color filter area and a second color filter area adjacent to each other, wherein the first color film area covers an orthographic projection of the second polarizer, and the second color film area is not covered by the orthographic projection of the second polarizer.

* * * * *